(12) United States Patent
Hsu et al.

(10) Patent No.: US 8,928,065 B2
(45) Date of Patent: *Jan. 6, 2015

(54) TRENCH DMOS DEVICE WITH IMPROVED TERMINATION STRUCTURE FOR HIGH VOLTAGE APPLICATIONS

(75) Inventors: Chih-Wei Hsu, Taipei (TW); Florin Udrea, Cambridge (GB); Yih-Yin Lin, Taipei (TW)

(73) Assignee: Vishay General Semiconductor LLC, Hauppauge, NY (US)

( * ) Notice: Subject to any disclaimer, the term of this patent is extended or adjusted under 35 U.S.C. 154(b) by 174 days.

This patent is subject to a terminal disclaimer.

(21) Appl. No.: 12/909,033

(22) Filed: Oct. 21, 2010

(65) Prior Publication Data

US 2011/0227152 A1 Sep. 22, 2011

Related U.S. Application Data

(63) Continuation-in-part of application No. 12/724,771, filed on Mar. 16, 2010.

(51) Int. Cl.
*H01L 29/76* (2006.01)

(52) U.S. Cl.
USPC ........... 257/328; 257/329; 257/330; 257/331; 257/332; 257/333; 257/334

(58) Field of Classification Search
USPC ................................................. 257/328–334
See application file for complete search history.

(56) References Cited

U.S. PATENT DOCUMENTS

| | | | |
|---|---|---|---|
| 6,309,929 B1 | 10/2001 | Hsu et al. | |
| 6,396,090 B1 | 5/2002 | Hsu et al. | |
| 6,621,107 B2 | 9/2003 | Blanchard | |
| 7,253,477 B2 | 8/2007 | Loechelt et al. | |
| 7,397,083 B2 | 7/2008 | Amali et al. | |

(Continued)

FOREIGN PATENT DOCUMENTS

JP 6-151867 5/1994

OTHER PUBLICATIONS

U.S. Appl. No. 12/909,033.*
US Final Office Action mailed Jan. 3, 2013 in connection with corresponding U.S. Appl. No. 12/724,771 (12 pages).

(Continued)

*Primary Examiner* — Samuel Gebremariam
(74) *Attorney, Agent, or Firm* — Stuart H. Mayer; Karin L. Williams; Mayer & Williams PC

(57) ABSTRACT

A termination structure for a power transistor includes a semiconductor substrate having an active region and a termination region. The substrate has a first type of conductivity. A termination trench is located in the termination region and extends from a boundary of the active region to within a certain distance of an edge of the semiconductor substrate. A doped region has a second type of conductivity disposed in the substrate below the termination trench. A MOS gate is formed on a sidewall adjacent the boundary. The doped region extends from below a portion of the MOS gate spaced apart from the boundary toward a remote sidewall of the termination trench. A termination structure oxide layer is formed on the termination trench and covers a portion of the MOS gate and extends toward the edge of the substrate. A first conductive layer is formed on a backside surface of the semiconductor substrate. A second conductive layer is formed atop the active region, an exposed portion of the MOS gate, and extends to cover at least a portion of the termination structure oxide layer.

18 Claims, 12 Drawing Sheets

(56) References Cited

U.S. PATENT DOCUMENTS

| | | |
|---|---|---|
| 2004/0195620 A1 | 10/2004 | Chuang et al. |
| 2005/0062124 A1 | 3/2005 | Chiola |
| 2005/0127465 A1 | 6/2005 | Chiola |
| 2005/0136613 A1 | 6/2005 | Poveda |
| 2005/0230744 A1 | 10/2005 | Wu |
| 2006/0054970 A1 | 3/2006 | Yanagida et al. |
| 2006/0102984 A1 | 5/2006 | Ranjan |
| 2006/0157745 A1 | 7/2006 | Lanois |
| 2007/0222018 A1 | 9/2007 | Poveda |
| 2008/0029812 A1 | 2/2008 | Bhalla |
| 2008/0087896 A1 | 4/2008 | Chiola |
| 2009/0057756 A1 | 3/2009 | Hshieh |
| 2009/0114923 A1 | 5/2009 | Iwamuro |

OTHER PUBLICATIONS

Supplementary European Search Report, EP11756731.3, Dec. 4, 2013, total pp. 8.

Supplementary European Search Report, EP11835123.8, Dec. 6, 2013, total pp. 10.

Narayanan et al., "Progress in MOS-controlled bipolar devices and edge termination technologies", Microelectronics Journal, Mackintosh Publications Ltd., Luton, GB, vol. 35, No. 3, Mar. 1 2004, pp. 235-248, XP004487511.

Hsu et al., "A Novel Trench Termination Design for 100-V TMBS Diode Application", IEEE Electron Device Letters, IEEE Service Center, New York, NY vol. 22, No. 11, Nov. 2011, pp. 551-552, XP011424525.

\* cited by examiner

TRENCH DMOS DEVICE WITH IMPROVED TERMINATION STRUCTURE FOR HIGH VOLTAGE APPLICATIONS

STATEMENT OF RELATED APPLICATION

This application is a continuation-in-part of U.S. patent application Ser. No. 12/724,771, entitled "Trench DMOS Device with Improved Termination Structure for High Voltage Applications", which is incorporated herein by reference in its entirety.

FIELD OF THE INVENTION

The present invention relates generally to a semiconductor device, and more particularly to a termination structure for a trench MOS device.

BACKGROUND

Conventionally, a Schottky diode includes a heavily-doped semiconductor substrate, typically made of single-crystal silicon. A second layer, referred to as aa drift region, covers the substrate and is a less heavily-doped layer having the same conducting type of carriers as the substrate. A metal layer or more currently a metal silicide forms a Schottky contact with the lightly-doped region and forms the diode anode.

Two opposing constraints arise when forming a unipolar component such as a Schottky diode. In particular, the components should exhibit the lowest possible on-state resistance (Ron) while having a high breakdown voltage. Minimizing the on-state resistance imposes minimizing the thickness of the less doped layer and maximizing the doping of this layer. Conversely, to obtain a high reverse breakdown voltage, the doping of the less doped layer must be minimized and its thickness must be maximized, while avoiding the creation of areas in which the equipotential surfaces are strongly bent.

Various solutions have been provided to reconcile these opposite constraints, which has led to the development of trench MOS-capacitance Schottky diode structures, which are referred to as Trench MOS Barrier Schottky (TMBS) diodes. In an example of such structures, conductive areas, for example, heavily-doped N-type polysilicon areas, are formed in an upper portion of a thick drift region less heavily N-type doped than an underlying substrate. An insulating layer insulates the conductive areas from the thick layer. An anode layer covers the entire structure, contacting the upper surface of the insulated conductive areas and forming a Schottky contact with the lightly-doped semiconductor region.

When reverse biased, the insulated conductive areas cause a lateral depletion of into the drift region, which modifies the distribution of the equipotential surfaces in this layer. This enables increasing the drift region doping, and thus reducing the on-state resistance with no adverse effect on the reverse breakdown voltage.

FIG. 1 is a simplified, partial view of a conventional TMBS Schottky diode or rectifier. The diode is formed from a heavily-doped N-type silicon wafer 1 on which is formed a lightly-doped N-type epitaxial layer 2. Openings are formed in this epitaxial layer, which may be, for example, trench-shaped. Conductive regions 3 are formed in the openings, which are made, for example, of doped polysilicon. An insulating layer 4 is interposed between each conductive region and the walls of the corresponding opening (e.g., trench). The insulating layer 4 may be formed, for example, by thermal oxidation and the opening may be filled with polysilicon by conformal deposition, followed by a planarization step. After this, a metal, for example, nickel, capable of forming a silicide 5 above the single-crystal silicon regions and 6 above the polysilicon filling areas, is deposited. Once the silicide has been formed, the metal which has not reacted with the silicon is removed by selective etch. After this, an anode metal deposition 7 is formed on the upper surface side and a cathode metal deposition 8 is formed on the lower surface side.

A key issue for achieving a high voltage Schottky rectifier is the design of its termination region. As with any voltage design, the termination region is prone to higher electric fields due to the absence of self multi-cell protection and the curvature effect. As a result, the breakdown voltage is typically dramatically reduced from its ideal value. To avoid this reduction, the termination region should be designed to reduce the crowding of the electric field at the edge of the device (near the active region). Conventional approaches to reduce electric field crowding include termination structures with local oxidation of silicon (LOCOS) regions, field plates, guard rings, trenches and various combinations thereof. One example of a Schottky diode that includes such a termination region is shown in U.S. Pat. No. 6,396,090.

Unfortunately, for high voltage applications these conventional designs for the termination region have had only limited success because the electric field distribution at the surface of the termination region is still far from ideal. At the same time, other problems arise because of degradations arising from hot carrier injection and the buildup of parasitic charges.

SUMMARY OF THE INVENTION

In accordance with one aspect of the invention, a termination structure is provided for a power transistor. The termination structure includes a semiconductor substrate having an active region and a termination region. The substrate has a first type of conductivity. A termination trench is located in the termination region and extends from a boundary of the active region to within a certain distance of an edge of the semiconductor substrate. A doped region has a second type of conductivity disposed in the substrate below the termination trench. A MOS gate is formed on a sidewall adjacent the boundary. The doped region extends from below a portion of the MOS gate spaced apart from the boundary toward a remote sidewall of the termination trench. A termination structure oxide layer is formed on the termination trench and covers a portion of the MOS gate and extends toward the edge of the substrate. A first conductive layer is formed on a backside surface of the semiconductor substrate. A second conductive layer is formed atop the active region, an exposed portion of the MOS gate, and extends to cover at least a portion of the termination structure oxide layer.

DETAILED DESCRIPTION

As detailed below, a termination structure is provided which reduces the aforementioned problems. In particular, the device exhibits better immunity to hot carrier injection degradation by reducing the orthogonal electric field component at the silicon/dielectric interface, since it is this interface that enhances the degree to which charge is trapped in the dielectric. The problems caused by parasitic charges can be reduced by either (i) designing the termination structure so that the electric field can be "flexibly" distributed, which allows movement of the electric field in the presence of parasitic charges without increasing the peak of the electric field or (ii) shielding the parasitic charge with floating conductive plates.

Figure 1:
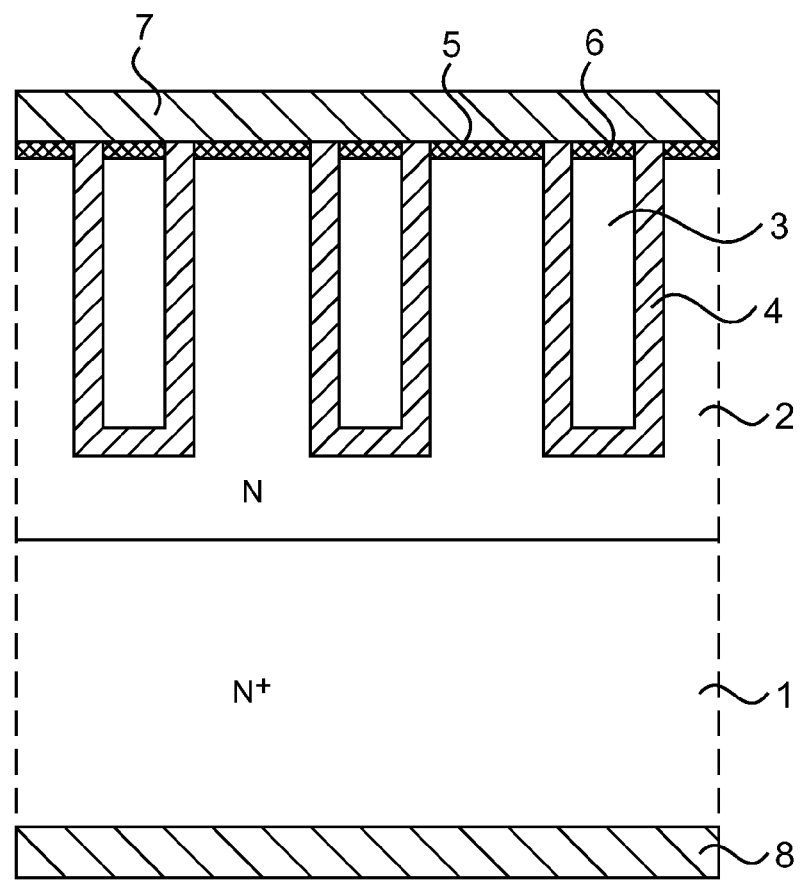
FIG. 1 is a simplified, partial view of a conventional TMBS Schottky diode or rectifier.
Figure 2:
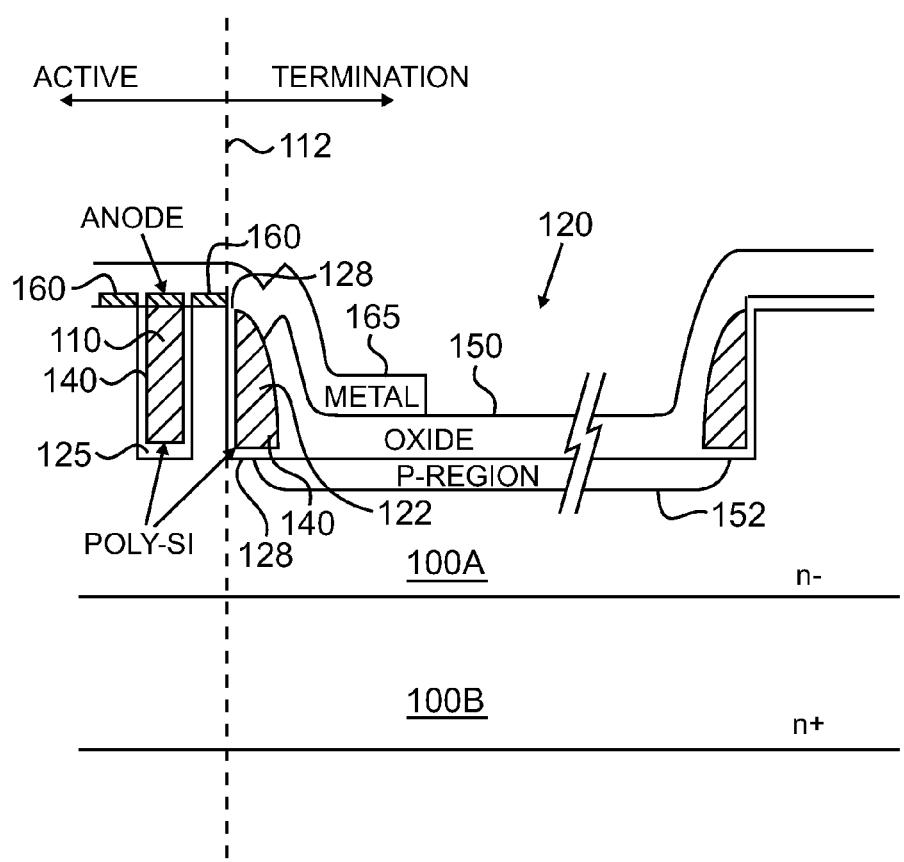
FIG. 2 shows a cross-sectional view of the active and termination regions of a TMBS Schottky diode constructed in accordance with the present invention.

FIG. 2 shows a cross-sectional view of the active and termination regions of a TMBS Schottky diode. The active region includes a semiconductor substrate 110B that is heavily doped with a dopant of a first conductivity type (e.g., n+ type). A first layer 100A is formed on the substrate 100B and is more lightly doped with a dopant of the first conductivity type (e.g., n– type). Trenches 110 (only one of which is shown) are formed in the first layer 100A. The trenches 110 are lined with an insulating layer 125 and filled with a conductive material 140 such as doped polysilicon. A metal layer 160 is formed over the exposed surfaces of the conductive material 140 and the first layer 100A. A Schottky contact is formed at the interface between the metal layer 160 and the first layer 100A. An anode metal 165 is formed over the metal layer 160. A cathode electrode (not shown) is located on the backside of the semiconductor substrate 100B.

The termination region of the TMBS Schottky diode shown in FIG. 2 includes a termination trench 120 that extends from the boundary 112 with the active region to within a certain distance from the edge of the semiconductor substrate 100B. A MOS gate 122 is formed on a sidewall of the termination region adjacent to the boundary 112 with the active region. The MOS gate 122 includes an insulating material 128 and a conductive material 122. The insulating material 128 lines the sidewall against which the MOS gate 122 is located and the portion of the first layer 100A adjacent to the sidewall. A conductive material 122 covers the insulating material 128. A termination oxide layer 150 is formed in the termination trench and extends from the MOS gate 122 toward the edge (but may terminate before the edge) of the device. An doped region 152 is formed in the first layer 100A and is doped with a dopant of a conductivity type (e.g., p-type) opposite to that of the first layer 100A. The doped region 152 is located beneath a portion of the MOS gate 122 and the termination oxide layer 150. The edge of the doped region 152 may extend to the boundary 112 and surrounds the corner of the MOS gate 122 and 128. The anode metal 165 located in the active region extend into the termination region and cover the MOS gate 122 and a portion of the termination oxide layer 150 to thereby define a field plate.

If the doped region 152 were not employed in the termination structure, high electric fields would still arise at high voltages. This is because all the reverse bias is sustained within a limited depletion region between the anode and cathode electrodes and the electric field rises quickly at the edge of the active region since the growth of the depletion region is limited by the relatively high doping in the n-type drift layer. To relieve the degree to which the electric field is crowded, the applied reverse bias needs to be dropped across a much larger depletion region. At the same time, orthogonal electric fields are present across the semiconductor/oxide interface (i.e., the electric field components perpendicular to the semiconductor/oxide interface). This leads to HCI into the oxide and hence long term degradation of the breakdown voltage.

Figure 3:
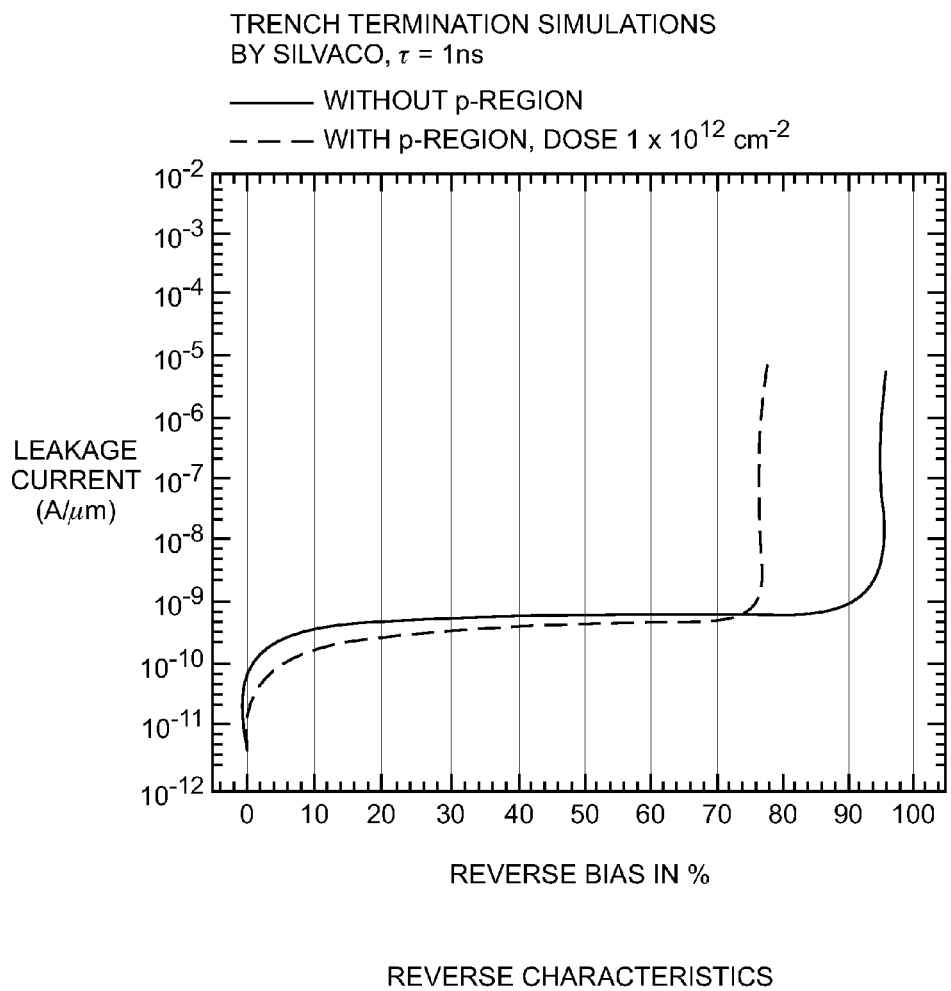
FIG. 3 shows the dependency of the leakage current on the reverse bias for the device of FIG. 2 both with and without the doped region.

The doped region 152 reduces this problem because it is fully depleted under a reverse bias and helps to push out the depletion region, effectively enlarging the width of the depletion region and hence reducing the electric field peaks near the active region of the device. Compared to a termination structure that does not include the doped region 152, the device shown in FIG. 2 has a breakdown voltage as high as 95% of the ideal breakdown voltage (i.e., the breakdown voltage of the active cell alone). This result is shown in FIG. 3, which shows the dependency of the leakage current on the reverse bias both with and without the doped region 152.

Figure 4:
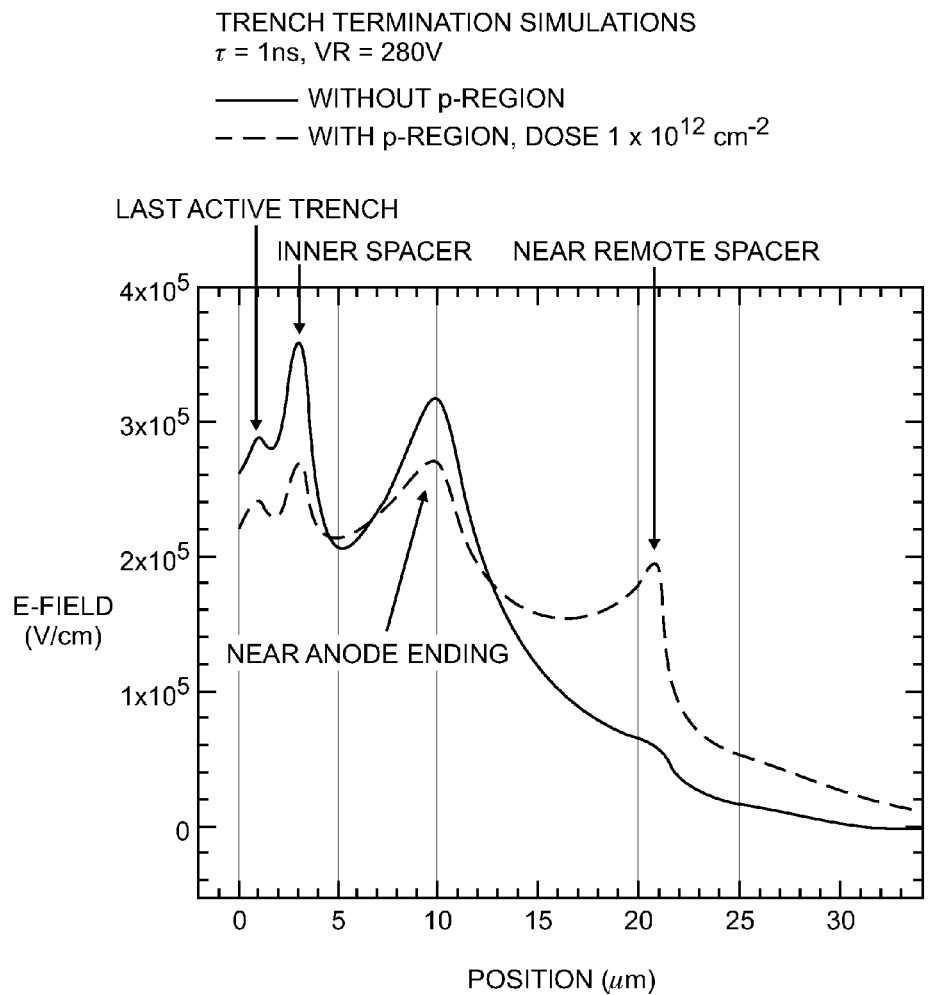
FIG. 4 shows the electric field at different positions along the A-A' line of the device of FIG. 2 both with and without the doped region.

In addition, the termination structure shown in FIG. 2 helps to lower the electric fields in the active region (specifically, the electric fields in the cells closer to the termination region). This is shown in FIG. 4, which shows the electric field at different positions along the device both with and without the doped region 152. This reduction in electric field arises because the doped region 152 serves to push the electric field further into the bulk, thereby reducing its presence at the trench surface.

Figure 5:
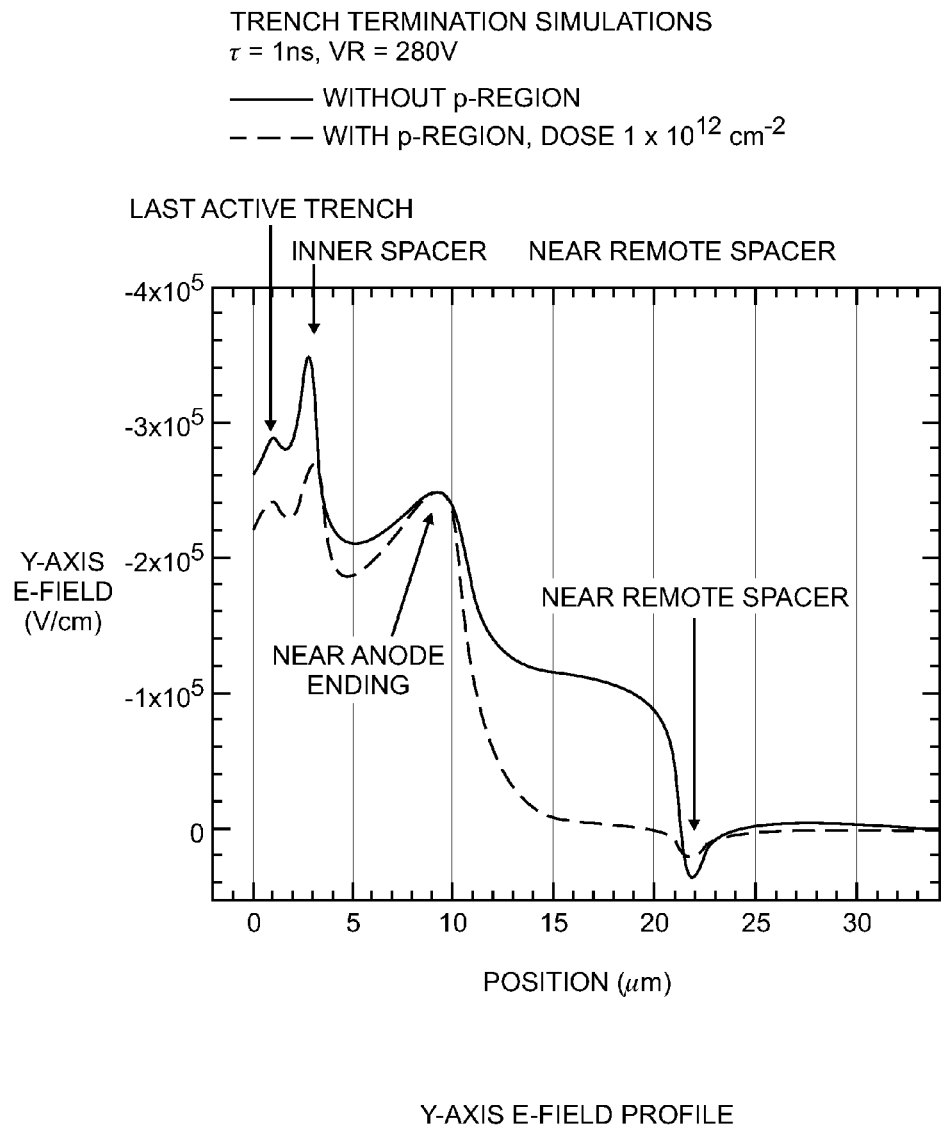
FIG. 5 shows the y-axis vector component of the electric field for the device in FIG. 2 both with and without the doped region.

The termination structure shown in FIG. 2 is also expected to have better reliability than conventional structures in terms of its immunity to HCI degradation. This is evident from FIG. 5, which shows the electric field along the y-axis (both with and without the doped region 152), which provides the momentum for injecting the carriers into the oxide layer. To reduce the HCI, the electric field along the y-axis should be as small as possible. The termination structure significantly lowers this electric field in the active region and the MOS gate 122, which is most susceptible to HCI in a conventional structure.

One example of a method that may be employed to form the TMBS Schottky diode of FIG. 2 will be described with reference to FIGS. 6-11. In this example the Schottky diode and its termination structure are formed simultaneously, though this need not always to be the case.

Figure 6:
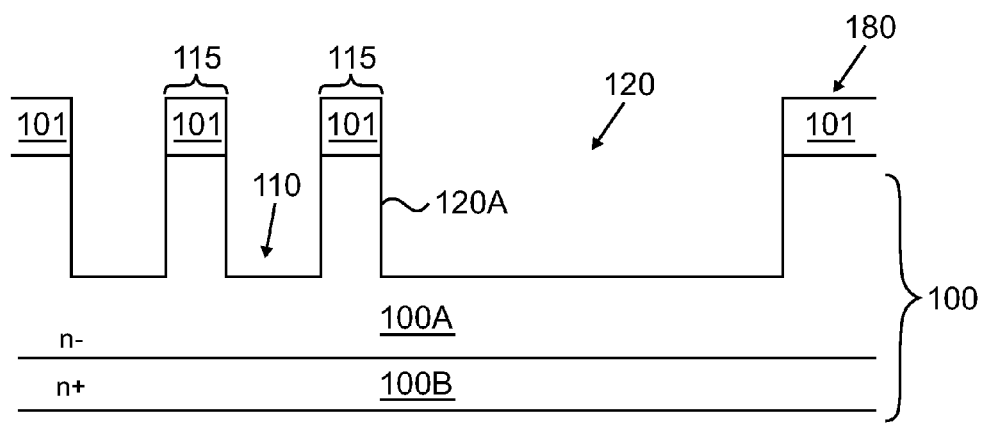
FIGS. 6-11 illustrate one example of the process steps that may be employed to fabricate the device of FIG. 2

FIG. 6 is a cross-sectional view of a semiconductor substrate 100 that includes a first layer 100A having a dopant of a first conductivity type (e.g., n– type) and a base substrate 100B which is more heavily doped with a dopant of the first conductivity type (e.g., n+ type). An oxide layer 101 is formed on the first substrate 100A by chemical vapor deposition (CVD), for example, to a thickness of about 2000-10,000 angstroms. Next, a photoresist (not shown) is coated on the oxide layer 101 to define a plurality of first trenches 110 in the active region and a second trench 120 in the termination region. The trenches 110 are spaced apart from one another by mesas 115. In one example each of the first trenches 110 is about 0.2-2.0 microns in width The second trench 120 forms the boundary from the edge of the active region and extends to within a certain distance from the edge of the semiconductor substrate 100 (or a die) and defines the termination region. A mesa 180 is defined between the edge of the second trench 120 most remote from the active region and the edge of the substrate 100.

Figure 7:
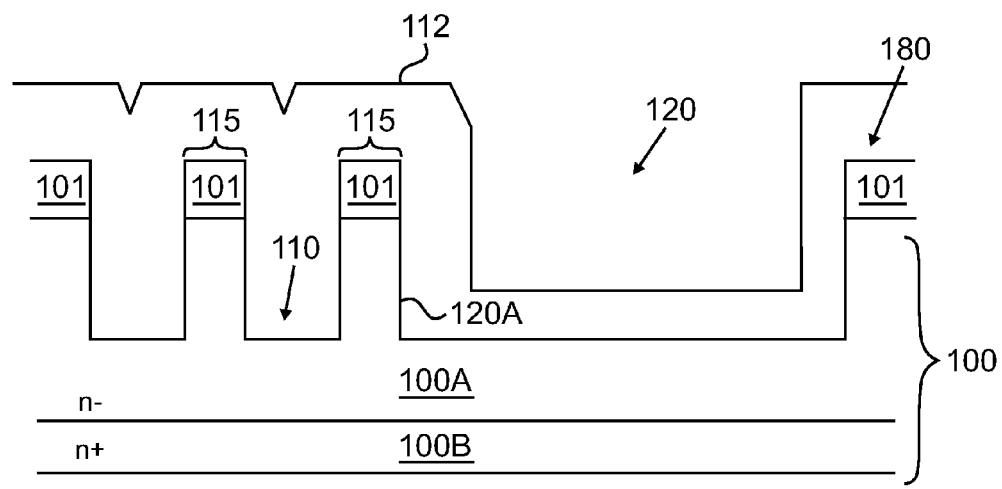
Figure 8:
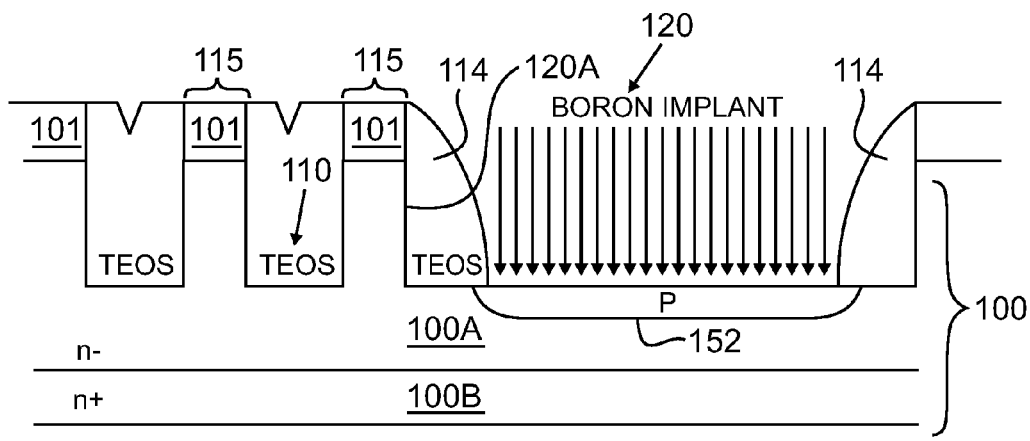

In FIG. 7 a dielectric layer such as a TEOS layer 112 is deposited over the entire structure and etched back in FIG. 8 so that it is removed from the trench 120 except for spacers 114 that are located against each sidewall of the trench 120. A p-type dopant such as boron is then implanted into the first layer 110A to form the doped region 152.

Figure 9:
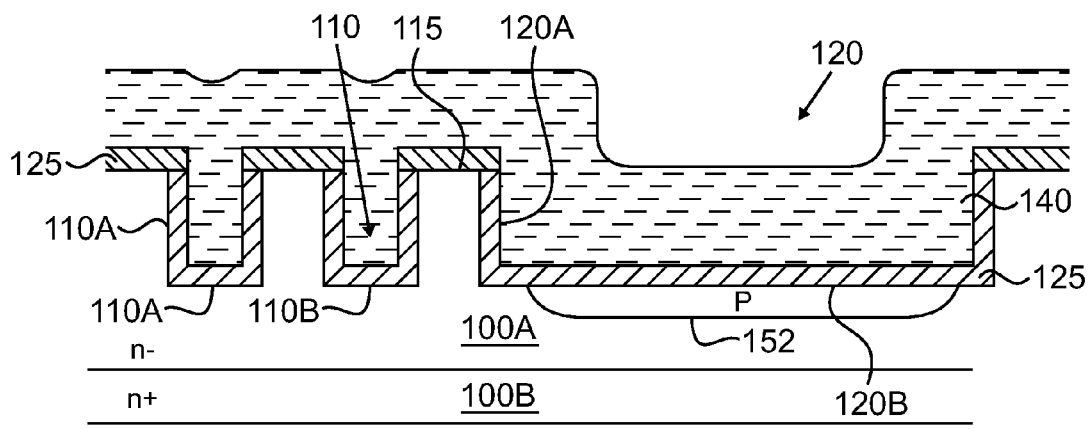

Referring to FIG. 9, after removal of the oxide layer 101 and TEOS spacer 114, a high temperature oxidation process is performed to form gate oxide layer 125. The gate oxide layer 125, which in some examples has a thickness between about 150 angstroms and 3000 angstroms, is formed on the sidewalls 110A, 120A and bottoms 110B, 120B of the first and second trenches 110, 120 and the surface of mesa 115. Instead of an oxidation process, the gate oxide layer 125 may be formed by high temperature deposition to form a HTO (high temperature oxide deposition) layer.

Next, a first conductive layer 140 is formed by CVD on the gate oxide 125 and fills the first trenches 110 and the second trench 120. The first conductive layer 140 has a thickness such that it extends over mesas 115. The first conductive layer 140 may be any suitable material such as a metal, doped-polysilicon or doped-amorphous silicon. The first conductive layer 140 may have a thickness of about 0.5 to 3.0 microns. In order to prevent voids from forming in the inner portion of the first trenches 110, the first conductive layer 140 may be polysilicon formed by an LPCVD (low pressure CVD) process, which has good step coverage. However, in some cases amorphous silicon may be better able to eliminate voids than polysilicon. To make the amorphous silicon conductive a recrystallization process may be employed.

Figure 10:
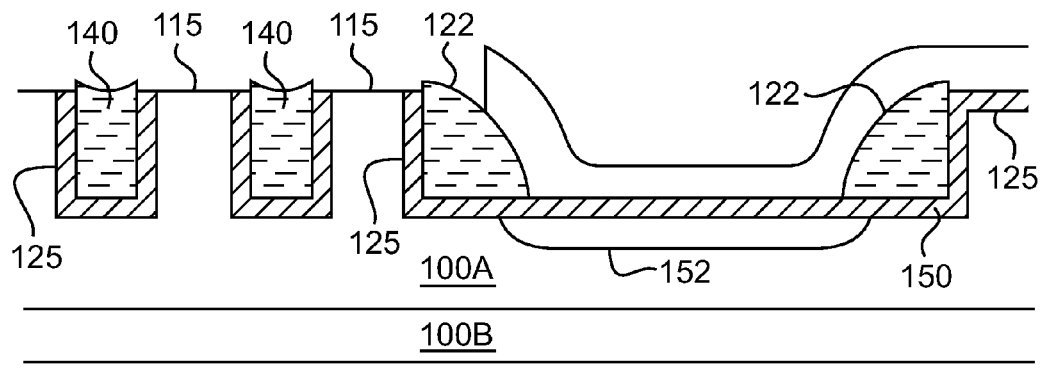

Referring now to FIG. 10, an anisotropic etching is performed to remove the excess first conductive layer 140. After this etching process, a spacer-like MOS gate 122 is formed from a conductive material on the oxide layer 125 lining the sidewall 125A of the second trench 120. In some examples the spacer-like MOS gate 122 has a width (along the cross-sectional view that is shown) that is about equal to the height of the second trench 120.

A dielectric layer 150 is next formed over the first layer 100A in the termination region using an etching process. The dielectric layer 150 may be, for example, a TEOS layer such as an LPTEOS or PETEOS layer or an $O_3$-TEOS or HTO layer. In some examples the thickness of the dielectric layer 150 may be between about 0.2-1.0 micron. The dielectric layer 150 partially covers the MOS gate 122.

Figure 11:
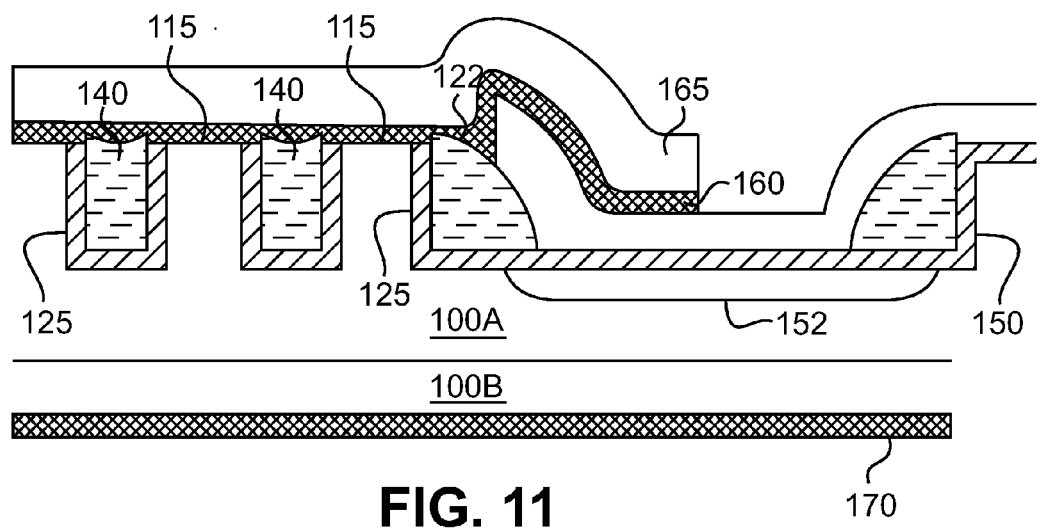

Next, in FIG. 11, a sputtering or other suitable process is performed to deposit a second conductive layer 160 so as to form Schottky contact regions 115A on mesas 115. The second conductive layer 160 may be formed from any material that can form a Schottky diode with the underlying first layer 100A. For example, second conductive layer 160 may be a metal silicide layer. After the formation of Schottky contacts, the conductive layer 160 is removed.

The method continues to deposit and etch a conductor to form the diode anode electrode 165, which may co-extensive with conductive layer 160. Likewise a cathode electrode 170 is formed on the backside of substrate 100B.

Figure 12:
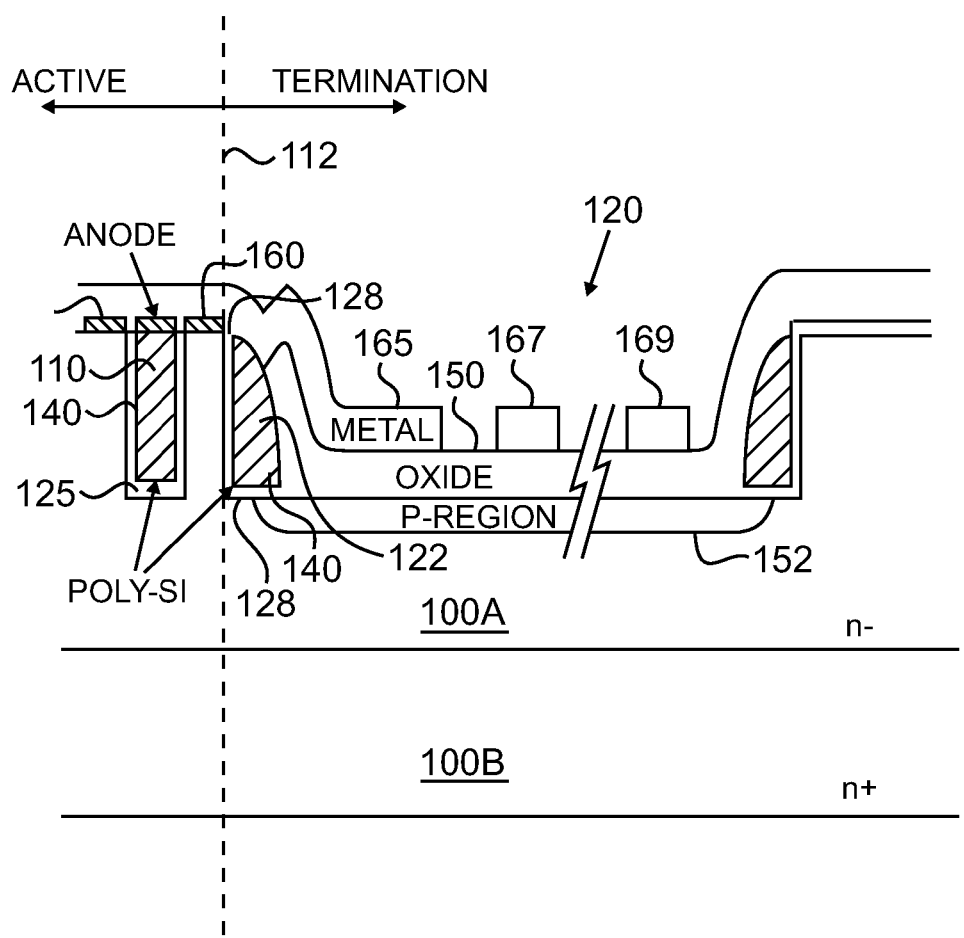
FIG. 12 shows a cross-sectional view of the active and termination regions of a TMBS Schottky diode constructed in accordance with another embodiment of the present invention.
Figure 13:
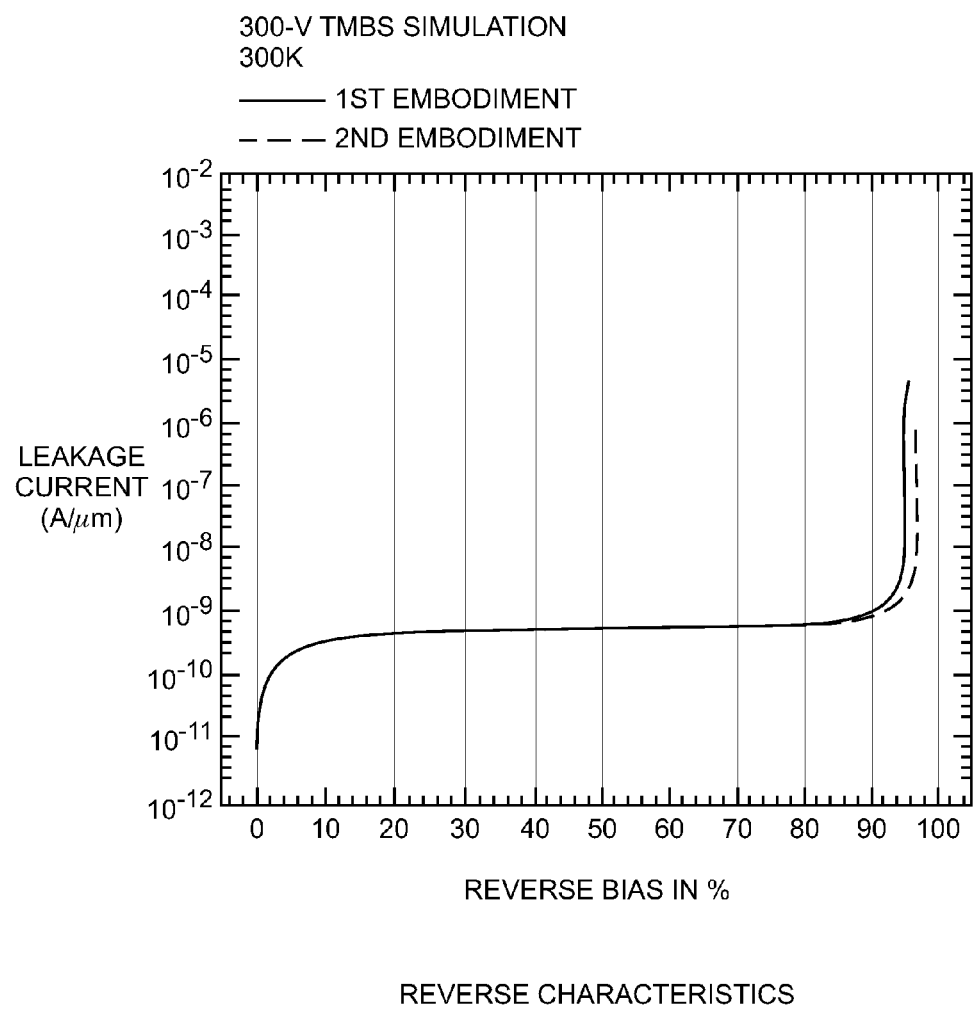
FIG. 13 shows the dependency of the leakage current on the reverse bias for the devices of FIG. 2 and FIG. 12.
Figure 14:
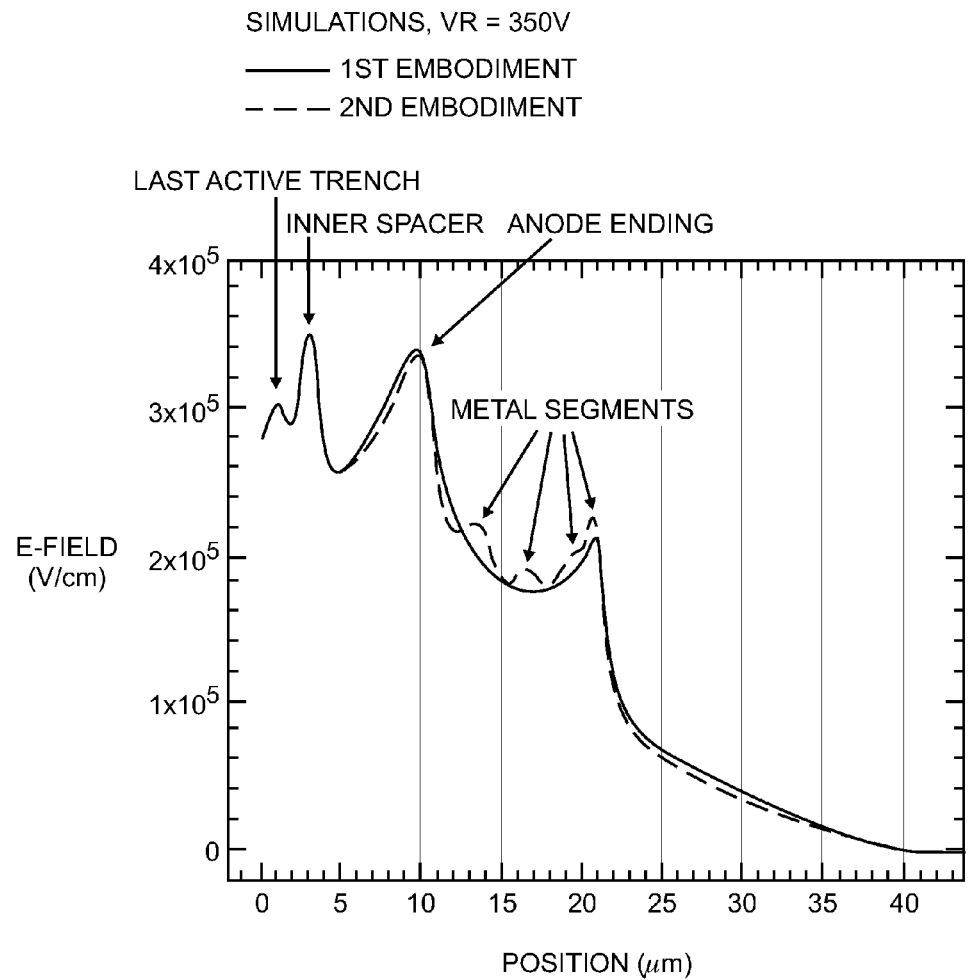
FIG. 14 shows the electric field at different positions along the devices of FIG. 2 and FIG. 12.

FIG. 12 shows an alternative embodiment of the invention which is similar to the embodiment depicted in FIG. 2 except that in FIG. 12 one or more additional segmented metal regions 167 are located on the dielectric layer 150 in the termination trench 120. Segmented metal regions 167 are used to enhance the accommodation of the reverse bias and thus help to reduce the electric field near the active region. The segmented metal regions 167 may be formed along with the anode electrode 165 with an additional etching step. FIG. 13 shows the breakdown voltage performance of the embodiment depicted in FIG. 2 and in FIG. 12. Clearly, the embodiment of FIG. 12 has a higher breakdown voltage (97% of the ideal value). The superior breakdown voltage of the FIG. 12 embodiment is likely attributable to the slightly lower electric filed in the active cell and the end of anode, as indicated in the electrical field profile of FIG. 14.

EXAMPLE

By way of illustration, various structural dimensions and parameters will be specified for one particular embodiment of the invention. In this embodiment the termination trench 120 has a width ranging from 10-200 microns and a depth that may be the same or different from the depth of the trenches 110 in the active region. Depending on the particular design and desired device characteristics (e.g., voltage capability, speed, leakage current) the depth of the termination trench 120 may range from 1-15 microns. The dielectric layer 150 located in the termination trench 120 may be silicon dioxide layer having a thickness between about 1500-15,000 angstroms, depending on the blocking voltage that is required and the composition of the material.

The field plate defined by the extension of conductive layers 160 and 165 into the termination region may have a length between about 4 and 45 microns in the termination trench 120. The doped region 152 may be formed by ion implantation and driven into the layer 100A by a thermal process. The implantation dosage may range about $1 \times 10^{11}$ atoms/cm$^2$ to $1 \times 10^{13}$ atoms/cm$^2$. The dopant may be boron, BF2, or another group-III element.

If one or more of the segmented metal regions 167 shown in FIG. 12 are employed, they may each have a width greater than about 0.4 microns with a spacing between them of between about 0.3 and 50 microns.

It should be noted that the termination structure described above may be used in connection with devices other than TMBS Schottky diodes, which has been presented by way of illustration only. For example, the termination structure can be applied to any power transistor such as a doubled diffused metal-oxide-semiconductor field effect transistor (DMOS-FET), an insulated gate bipolar transistor (IGBT) and other trench MOS devices.

Figure 15:
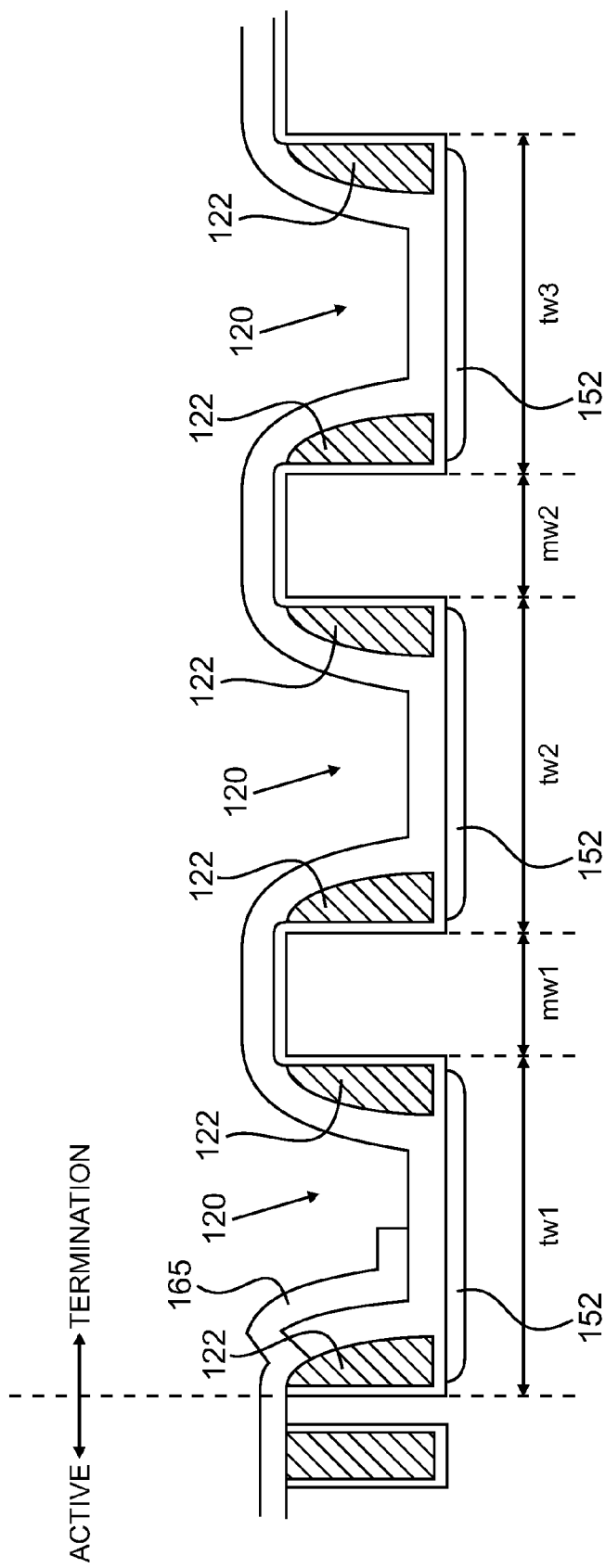
FIG. 15 shows an alternative embodiment of a TMBS Schottky diode constructed in accordance with the present invention.

A further embodiment is shown in FIG. 15, which shows that there may be multiple termination trenches 120 (three ones herein). The trench width of each termination trench 120 (tw1, tw2, tw3) can be the same or different. Similarly, the mesa width (mw1, mw2) can be identical or different from one another. The anode metal can end in the first trench, or any position in the termination region. Similar to the embodiment shown in FIG. 12, the anode metal can be segmented to enhance breakdown capability.

The invention claimed is:
1. A termination structure for a power transistor, said termination structure comprising:
    a semiconductor substrate having an active region and a termination region, the substrate having a first type of conductivity;

a termination trench located in the termination region and extending from a boundary of the active region to within a certain distance of an edge of the semiconductor substrate;

a doped region having a second type of conductivity disposed in the substrate below the termination trench;

a MOS gate formed on a sidewall adjacent the boundary, wherein the doped region extends from below a portion of the MOS gate spaced apart from the boundary toward a remote sidewall of the termination trench;

a termination structure oxide layer formed on the termination trench covering a portion of the MOS gate and extending toward the edge of the substrate, the termination structure oxide layer and the doped region being in contact with one another and defining an interface therebetween;

a first conductive layer formed on a backside surface of the semiconductor substrate; and a second conductive layer formed atop the active region, an exposed portion of the MOS gate, and extending to cover at least a portion of the termination structure oxide layer.

2. The termination structure of claim 1 further comprising a plurality of trench MOS devices spaced from each other and formed in the active region of the semiconductor substrate.

3. The termination structure of claim 1, wherein said MOS gate comprises a conductive layer and a gate oxide layer formed between a bottom of the termination trench and the conductive layer.

4. The termination structure of claim 1, wherein said trench MOS device is a Schottky diode.

5. The termination structure of claim 4, wherein said Schottky diode is a TMBS Schottky diode that includes at least one trench in the active region of the substrate.

6. The termination structure of claim 1, wherein said power transistor is a device selected from the group consisting of Schottky diodes, DMOSs, and IGBTs.

7. The termination structure of claim 1, further comprising one or more segmented metal regions located on the termination structure oxide layer and spaced apart from the second conductive layer.

8. The termination structure of claim 1, wherein the doped region is formed by implantation or diffusion.

9. The termination structure of claim 1, wherein the doped region is formed by implantation with an implantation dosage of between about $1 \times 10^{11}$ atoms/cm$^2$ to $1 \times 10^{13}$ atoms/cm$^2$.

10. A Schottky diode, comprising:
a semiconductor substrate having a plurality of trench MOS devices spaced from each other formed in an active region of the semiconductor substrate, the substrate having a first type of conductivity;

a termination trench located in a termination region and extending from a boundary of the active region to within a certain distance of an edge of the semiconductor substrate;

a doped region having a second type of conductivity disposed in the substrate below the termination trench;

a MOS gate formed on a sidewall adjacent the boundary, wherein the doped region extends from below a portion of the MOS gate spaced apart from the boundary toward a remote sidewall of the termination trench;

a termination structure oxide layer formed on the termination trench covering a portion of the MOS gate and extending toward the edge of the substrate, the termination structure oxide layer and the doped region being in contact with one another and defining an interface therebetween;

a first conductive layer formed on a backside surface of the semiconductor substrate;

a second conductive layer formed atop the active region to define one or more Schottky barriers with one or more portions of the substrate located between adjacent ones of the trench MOS devices; and a field plate extending over an exposed portion of the MOS gate and at least a portion of the termination structure oxide layer.

11. The Schottky diode of claim 10 wherein said field plates includes an extension of the second conductive layer into or over the termination trench.

12. The Schottky diode of claim 10, wherein said semiconductor substrate comprises a first layer and a base substrate, and said first layer has a first type of conductive impurities lightly doped and said base substrate has said first type of conductive impurities heavily doped.

13. The Schottky diode of claim 12, wherein said trench MOS devices and said termination trench are formed in said first layer having a depth of between about 1-15 microns.

14. The Schottky diode of claim 13, wherein said termination trench has a width between about 10-200 microns.

15. The Schottky diode of claim 10, wherein said termination trench is formed from the boundary of the active region and extends to within a certain distance of an edge of the semiconductor substrate, so that said termination trench has at least one sidewall.

16. The Schottky diode of claim 10 wherein said trench MOS devices and said MOS gate include a material selected from the group consisting of metal, polysilicon, and amorphous silicon.

17. The Schottky diode of claim 10, further comprising one or more segmented metal regions located on the termination structure oxide layer and spaced apart from the field plate.

18. The Schottky diode of claim 17, further comprising at least two segmented metal regions spaced apart from one another by between about 0.3 and 50 microns.

* * * * *